(12) United States Patent
Koops

(10) Patent No.: US 7,244,369 B2
(45) Date of Patent: *Jul. 17, 2007

(54) METHOD FOR PRODUCING ACTIVE OR PASSIVE COMPONENTS ON A POLYMER BASIS FOR INTEGRATED OPTICAL DEVICES

(75) Inventor: Hans Wilfried Peter Koops, Ober-Ramstadt (DE)

(73) Assignee: Deutsche Telekom AG, Bonn (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/462,283

(22) PCT Filed: Jul. 5, 1997

(86) PCT No.: PCT/EP97/03558

§ 371 (c)(1),
(2), (4) Date: Mar. 29, 2000

(87) PCT Pub. No.: WO99/03021

PCT Pub. Date: Jan. 21, 1999

(65) Prior Publication Data

US 2003/0052081 A1 Mar. 20, 2003

(51) Int. Cl.
*B29D 11/00* (2006.01)
(52) U.S. Cl. .............................. 216/24; 216/41; 216/58; 438/7; 438/9; 438/725; 438/733; 365/132

(58) Field of Classification Search ................. 216/24, 216/41, 58; 438/7, 9, 725, 733; 365/132
See application file for complete search history.

(56) References Cited

U.S. PATENT DOCUMENTS 4,704,347 A * 11/1987 Vollenbroek et al. ....... 430/312

(Continued)

FOREIGN PATENT DOCUMENTS

DE     24 60 716     5/1976

(Continued)

OTHER PUBLICATIONS

Brenner et al., "Deep Portion Irradiation of PMMA for a 3D Integration of Optical Components," pp. 159-176. 1993.*

(Continued)

*Primary Examiner*—Shamim Ahmed
(74) *Attorney, Agent, or Firm*—Kenyon & Kenyon LLP

(57) ABSTRACT

"A process for fabricating active and passive, polymer-based components for use in integrated optics. As a result of this process, active and passive optoelectronic components of a high quality having a high level of integration and high packing density are fabricated. A patternable polymer resist layer of a high quality is deposited onto an optoelectronic component. An etching mask is used in conjunction with a high-grade anisotropic deep etching to produce a pattern, which is filled with monomers through gas-phase or liquid-phase diffusion. The optical properties of the optical component can be selectively changed as a function of the type of monomers used for the diffusion, as well as of the temperature and application time. The process makes it possible to increase the packing density of future integrated monomode optics and simultaneously produce large quantities in a cost-effective manner."

8 Claims, 1 Drawing Sheet

U.S. PATENT DOCUMENTS

| | | | | |
|---|---|---|---|---|
| 4,751,170 | A | * | 6/1988 | Mimura et al. ............. 430/296 |
| 4,824,522 | A | * | 4/1989 | Baker et al. .................. 216/24 |
| 5,102,776 | A | * | 4/1992 | Hammer et al. ............ 430/311 |
| 5,116,461 | A | * | 5/1992 | Lebby et al. ................... 216/2 |
| 5,265,185 | A | | 11/1993 | Ashley ........................ 385/132 |
| 5,943,464 | A | * | 8/1999 | Khodja ........................ 385/122 |

FOREIGN PATENT DOCUMENTS

| | | |
|---|---|---|
| DE | 24 60 715 | 6/1976 |
| DE | 24 46 789 | 9/1976 |
| DE | 25 15 550 | 10/1976 |
| DE | 196 16 324 | 10/1997 |
| EP | 0 614 126 | 9/1994 |
| JP | 63 249837 | 10/1988 |
| JP | 402140749 A * | 5/1990 |

OTHER PUBLICATIONS

Eguchi et al., "Graident Index Polymer optical Waveguide Patterned by Ultraviolet Irradiation." Japanese Journal of Applied Physics, vol. 28, No. 12, Dec. 1, 1989,pp. 2232-2235.*

Kashyap, "Photosensitive Optical Fibers: Devices and Applications," Opt. Fibres Techn. 1, pp. 17-314 (1994).

Cremer et al., "Bragg Gratings on InGaAsP/InP-Waveguides as Polarization Independent Optical Filters," J. of Lightwave Techn., 7,11, 1641 (1989).

Alferness et al., "Broadly tunable InGaAsP/InP buried rib waveguide vertical coupler filter," Appl. Phys. Lett., 60, 8, 980 (1992).

Wu et al., "InGaAsP/Inp Vertical Filter with Optimally Designed Wavelength Tunability," IEEE Photonics Technol. Lett., 4, 4, 457 (1993).

Chuang et al., "Enhanced wavelength tuning in grating assisted codirectional coupler filter," IEEE Photonics Technology Lett., 5, 10, 1219 (1993).

Lösch et al., "Optical Waveguide Materials," (M.M. Broer, G.H. Sigel, Jr., R. Th. Kersten, H. Kawazoe ed) Mat. Res. Soc. 244, Pittsburg, PA 1992, pp. 253-262.

Ebeling, "Integrierte Optoelektronik," (Springer Verlag 1989) 81; pp. 78-88.

Kerber et al., "Surface imaging with HMCTS on SAL resists, a dry developable electron beam process with high sensititivity and good resolution," Microelectronic Engineering 21 (1993) 275-278.

Koops et al., "Endpoint detection for silylation processes with waveguide modes," Microelectronic Engineering 21 (1993) 235-238, and in source 10, by J. Vac, SCI Technol. B6(1) (1988) 477.

Kallweit et al., "Ion Beam Induced Changes of the Refractive Index of PMMA," Radiation Effects and Defects in Solids, 1991, vol. 116, pp. 29-36, and in source 12 by Kallweit et al.

Kallweit et al., "Long-Term Studies on the Optical Performance of Ion Implanted PMMA Under the Influence of Different Media," Mat. Res. Soc. Symp. Proc. vol. 338 (1994) 619-624.

Eich et al., "Second harmonic generation in poled organic monomeric glasses," J. Opt. Soc. Am B, 6, 8, (1989).

Eich et al., "Corona Poling and Real Time Second Harmonic Generation Study of a Novel Covalently Functionalized Amorphous Nonlinear Optical Polymer," J. Appl. Phys., 66, 6, (1989) R. Birenheide.

Eich et al., "Analysis of Reorientational Processes in Liquid Crystalline Side Chain Polymers Using Dielectric Relaxation, Electro-Optical Relaxation and Switching Studies," Mol. Cryst. Liq. Cryst., 177, 13 (1989).

Eich et al., "Poled Amorphous Polymers of Second Order Nonlinear Optics," Polymers for Advanced Technologies, 1, 189 (1990).

Stadler et al., "Electrically switchable diffractive optical element for image processing," Optics Letters 19, 1 (1994).

Koops et al., "High Resolution Electron Beam Induced Deposition," Proc. 3 1. Int. Symp. On Electron, Ion, and Photon Beams, J. Vac. Sci. Technol. B 6 (1) (1988) 477.

Koops et al., "Constructive 3-dimensional Lithography with Electron Beam Induced Deposition for Quantum Effect Devices," J. Vac. Sci. Technol. B 10(6) Nov., Dec. (1993) 2386-2389.

Koops et al., "Characterization and application of materials grown by electron beam induced deposition," Invited lecture Micro Process 1994, Jpn. J. Appl. vol. 33 (1994) 7099-7107, part 1 No. 12B, Dec. 1994.

Koops, "Capacities of Electron Beam Reducing Image Projection Systems having Dynamically Compensated Field Aberrations," Microelectronic Engineering 9 (1989) 217-220.

Elsner et al., "Multiple Beam-shaping Diaphragm for Efficient Exposure of Gratings," J. Vac. Sci. Technol. B 0(6) Nov., Dec. (1993) 2373-2376.

Elsner et al., "Advanced Multiple Beam-shaping Diaphragm for Efficient Exposure," Microelectronic Engineering 23 (1994) 85-88.

Rüb et al., "Electron-beam-induced deposition in a reducing image projector," Microelectronic Engineering 9 (1989) 251-254.

H.W.P. Koops et al, 3-Dimensionale Photonen Kristalle hergestellt durch Additive Korpuskularstrahl-Lithographie, Aug. 20, 1985.

Ehrfeld et al., "Integrated Optics and Micro-Optics with Polymers," 1993, B.G. Teunber Verlag.*

Brenner et al., "Deep Proton Irradiation of PMMA for a 3D Integration of Optical Components," pp. 159-176*, 1993.

Eguchi et al., "Gradient Index Polymer Optical Waveguide Patterned by Ultraviolet Irradiation," Japanese Journal of Applied Physics, vol. 28, No. 12, part 02, Dec. 1, 1989, pp. L2232-2235.*

Lazare et al., "Microlenses Fabricated by Ultraviolet Excimer Laser Irradiation of Poly(Methyl Methacrylate) Followed by Styrene Diffusion," Applied Optics, vol. 35, No. 22, Aug. 1, 1996, pp. 4471-4475.*

* cited by examiner

METHOD FOR PRODUCING ACTIVE OR PASSIVE COMPONENTS ON A POLYMER BASIS FOR INTEGRATED OPTICAL DEVICES

BACKGROUND INFORMATION

The present invention relates to the fabrication of active and passive polymer-based, optoelectronic components. The technical task at hand is to devise a method directed to the fabrication of passive and active optoelectronic components having a high level of integration and high packing density. The fabrication process should make it possible to influence the parameters and properties of the optoelectronic component to be produced, in particular, to selectively influence the refractive index, nonlinear optical property, polarizability, double refraction and amplification properties during the fabrication process.

As described in

1.] R. Kashyap, in "Photosensitive Optical Fibers: Devices and Applications", Opt. Fibres Techn. 1, pp. 17–314 (1994), present-day fabrication processes for components and circuits of integrated optics are based on optical fiber technology which strives for an "all-fiber" solution for the circuits required in telecommunications. Integrated optical waveguide circuits are constructed, together with active and passive components on expensive semiconductor substrates, using even more expensive molecular beam epitaxy or metal organic deposition from the vapor phase, to implement the optical circuits required in telecommunications. A description of such processes can be found in the following sources:

2.] C. Cremer, H. Heise, R. März, M. Schienle, G. Schulte-Roth, H. Unzeitig, "Bragg Gratings on InGaAsP/InP-Waveguides as Polarization Independent Optical Filters" J. of Lightwave Techn., 7, 11, 1641 (1989);

3.] R. C. Alferness, L. L. Bühl, U. Koren, B. I. Miller, M. G. Young, T. L. Koch, C. A. Burrus, G. Raybon, "Broadly tunable InGaAsP/InP buried rib waveguide vertical coupler filter", Appl. Phys. Lett., 60, 8, 980 (1992);

4.] Wu, C. Rolland, F. Sheperd, C. Larocque, N. Puetz, K. D. Chik, J. M. Xu, "InGaAsP/Inp Vertical Filter with Optimally Designed Wavelength Tunability", IEEE Photonics Technol. Lett., 4, 4, 457 (1993);

5.] Z. M. Chuang, L. A. Coldren "Enhanced wavelength tuning in grating assisted codirectional coupler filter", IEEE Photonics Technology Lett., 5, 10, 1219 (1993).

Also known is a process for fabricating waveguide circuits from polymeric waveguides using mask-assisted exposure processes, as described in source 6.] by L-H. Lösch, P. Kersten and W. Wischmann in "Optical Waveguide Materials" (M. M. Broer, G. H. Sigel Jr., R. Th. Kersten, H. Kawazoe ed) Mat. Res. Soc. 244, Pittsburg, Pa. 1992, pp. 253–262.

A further known design approach is based on defining the waveguides by etching a step into optically thinner layers. A process of this kind is described by 7.] K. J. Ebeling in "Integrierte Optoelektronik" (Springer Verlag 1989) 81.

1. A further known process is based on silylation. In the silylation process, waveguides are already defined in NOVOLAK, and checked for their usability in integrated optics, as described in source 8.] by T. Kerber, H. W. P. Koops in "Surface imaging with HMCTS on SAL resists, a dry developable electron beam process with high sensitivity and good resolution", Microelectronic Engineering 21 ((1993) 275–278.

2. The processes required for this and for accurate process control are described in source 9.] by H. W. P. Koops, B. Fischer, T. Kerber, in "Endpoint detection for silylation processes with waveguide modes", Microelectronic Engineering 21 (1993) 235–238, and in source 10.] by J. Vac, SCI Technol. B 6 (1) (1988) 477.

Substantial differences in refractive indices can be produced by implanting ions at high energies and high doses in PMMA. Processes of this kind are described in source 11.] by R. Kallweit, J. P-Biersack in "Ion Beam Induced Changes of the Refractive Index of PMMA", Radiation Effects and Defects in Solids, 1991, vol. 116, pp. 29–36, and in source 12.] by R. Kallweit, U. Roll, J. Kuppe, H. Strack "Long-Term Studies on the Optical Performance of Ion Implanted PMMA Under the Influence of Different Media", Mat. Res. Soc. Symp. Proc. Vol. 338 (1994) 619–624. In this context, differences in the refractive indices in solid PMMA material of up to 20% are obtained. However, masking processes must be used for patterning. Due to the high ion energy and the required absorber layer thickness in the mask, the resolution is limited by the edge roughness that is attainable using mask fabrication technologies. Electrically switchable regions incorporated in waveguides can be produced by diffusing poled, nonlinearly optical materials in polymers. In this manner, one can achieve a link to electrical adjustability of optical paths, or to the influencing of optical processes.

13.] M. Eich, H. Looser, D. Y. Yoon, R. Twieg, G. C. Bjorklund, "Second harmonic generation in poled organic monomeric glasses", J. Opt. Soc. Am. B, 6, 8, (1989);

14.] M. Eich, A. Sen, H. Looser, G. C. Björklund, J. D. Swalen, R. Twieg, D. Y. Yoon, "Corona Poling and Real Time Second Harmonic Generation Study of a Novel Covalently Functionalized Amorphous Nonlinear Optical Polymer", J. Appl. Phys., 66, 6, (1989)R. Birenheide;

15.] M. Eich, D. A. Jungbauer, O. Herrmann-Schönherr, K. Stoll, J. H. Wendorff, "Analysis of Reorientational Processes in Liquid Crystalline Side Chain Polymers Using Dielectric Relaxation, Electro-Optical Relaxation and Switching Studies", Mol. Cryst. Liq. Cryst., 177, 13 (1989);

16.] M. Eich, G. C. Björklond, D. Y. Yoon, "Poled Amorphous Polymers of Second Order Nonlinear Optics", Polymers for Advanced Technologies, 1, 189 (1990) M. Stalder, P. Ehbets, "Electrically switchable diffractive optical element for image processing", Optics Letters 19, 1 (1994).

Free configurability of the pattern is achieved if, using the new process of additive lithography, three-dimensional patterns and periodic arrangements are constructed on any desired, inexpensive substrates, and if the refractive index of the deposited material is adapted to the task, by properly selecting the precursor material, as well as the sources listed below, are named as sources for the aforementioned subject area.

17.] M. Stalder, P. Ehbets, "Electrically switchable diffractive optical element for image processing", Optics Letters 19, 1 (1994);

18.] H. W. P. Koops, R. Weiel, D. P. Kern, T. H. Baum, "High Resolution Electron Beam Induced Deposition", Proc. 3 1. Int. Symp. On Electron, Ion, and Photon Beams, J. Vac. Sci. Technol. B 6(1) (1988) 477;

19.] H. W. P. Koops, J. Kretz, M. Rudolph, M. Weber "Constructive 3-dimensional Lithography with Electron Beam Induced Deposition for Quantum Effect Devices", J. Vac. Sci. Technol. B 10(6) November, December (1993) 2386–2389;

20.] H. W. P. Koops, J. Kretz, M. Rudolph, M. Weber, G. Dahm, K. L. Lee "Characterization and application of materials grown by electron beam induced deposition", Invited lecture Micro Process 1994, Jpn. J. Appl. Vol. 33 (1994) 7099–7107, part. 1 no. 12B, December 1994;

21.] Hans W. P. Koops, Shawn-Yu Lin, "3-Dimensional Photon Crystals Generated Using Additive Corpuscular-Beam-Lithography" patent specification filed on Aug. 20, 1995.

It is, thus, possible to construct narrow-band, geometrical and permanently adjustable filters and highly reflective mirrors on a miniaturized scale from photon crystals. If the photon crystals produced using deposition techniques are combined with nonlinear, optical materials in the interstices of the deposited materials, it is possible to obtain miniaturized, adjustable optical components [source 21.]

Present-day surface-imaging processes make it possible, using optical phase masks and steppers and, with the use of dry etching processes, to achieve the resolution and height ratios required for optical gratings and other optical elements. This can be achieved using the lithography and process equipment of the manufacturers of electronic storage devices having a 1 G-bit size, and corresponding resolution. High-throughput production processes are used in corpuscular-beam optical miniaturization techniques, as explained in the following sources:

23.] H. Koops, 1974, German Patent 2446 789.8–33 "Corpuscular-Beam Optical Device for Corpuscular Irradiation of a Preparation";

24.] H. Koops, 1974, German Patent 2460 716.7 "Corpuscular-Beam Optical Device for Corpuscular Irradiation of a Preparation";

25.] H. Koops, 1974, German Patent 2460 715.6 "Corpuscular-Beam Optical Device for Corpuscular Irradiation of a Preparation in the Form of a Two-Dimensional Pattern having a Plurality of Identical Two-Dimensional Elements";

26.] H. Koops, 1975, German Patent 2515 550.4 "Corpuscular-Beam Optical Device for Imaging a Mask onto a Preparation to be Irradiated";

27.] H. W. P. Koops, "Capacities of Electron Beam Reducing Image Projection Systems having Dynamically Compensated Field Aberrations" Microelectronic Engineering 9 (1989) 217–220.

A further known miniaturization technique is based on techniques using small mask templates as described in the following sources:

28.] H. Elsner, P. Hahmann, G. Dahm, H. W. P. Koops "Multiple Beam-shaping Diaphragm for Efficient Exposure of Gratings" J. Vac. Sci. Technol. B 0(6) November, December (1993) 2373–2376;

29.] H. Elsner, H.-J. Doring, H. Schacke, G. Dahm, H. W. P. Koops "Advanced Multiple Beam-shaping Diaphragm for Efficient Exposure", Microelectronic Engineering 23 (1994) 85–88.

Miniaturization can also be achieved through the use of electron-beam-induced deposition in projectors.

30.] M. Rüb, H. W. P. Koops, T. Tschudi "Electron-beam-induced deposition in a reducing image projector", Microelectronic Engineering 9 (1989) 251–254.

At the present time, one does not know of integrated optical patterns, where the process of refractive index modulation is employed by diffusing nonlinear optical, high-refractive-index or liquid-crystal monomers into existing polymers, in conjunction with free-standing polymer patterns, where the refractive index difference with respect to the vacuum is used as the essential step for the refractive index increases.

SUMMARY OF THE INVENTION

The process according to the present invention for fabricating active and passive optical components is based on the generally known processes of surface imaging, to produce an oxygen-resistant etching mask in unexposed regions, and of diffusing molecules into patterned polymer layers.

According to the present invention, at least one patterned, highly sensitive polymer resist layer is deposited on an optoelectronic component, made of glass and conductor path, or of substrate. Defined regions of the polymer resist layer are subsequently exposed, producing an etching mask. High-grade anisotropic deep etching is performed on the unprotected regions to transfer the etching mask to the polymer resist layer located underneath the etching mask. The exposed regions of the polymer resist layer are ablated in the vertical direction, uncovering the unexposed side surfaces of the regions protected by the etching mask.

In the ensuing gas-phase or liquid-phase diffusion process, the unexposed polymer resist layer is filled with monomers, from its surface, through the mask of the surface masking and, from its side surfaces uncovered by the oxygen deep etching, with the application of heat. In the process, monomers are used, which are suited for breaking up the already existing pattern of the polymer, and for repatterning it, so that the optical properties of the optoelectronic component can be selectively changed as a function of the type of monomers used, and also as a function of the temperature and application time. In the diffusion process, the polymer then swells on all sides and, therefore, the previously lost edge region can be compensated selectively by the swollen material and, in a controlled manner, by the diffusion time and temperature. In addition, because of the acting surface tension, the surfaces produced by the swelling are very smooth, i.e. peak-to-valley heights in the 2 nm range are obtained. The obtained refractive index profile is assured in the long term by UV hardening and by deep crosslinking of the diffused molecules carried out after the diffusion.

By diffusing heavy metal oxide-containing, nonlinearly optical or liquid-crystal monomers or also molecules containing "rare earths" into the uncovered, deep polymer patterns, it is possible, in addition to passive materials, also to produce nonlinearly optical, active materials in selected regions. It is, therefore, possible to produce diffused refractive index profiles in regions defined by optical and corpuscular beam lithography.

Brief Description Of The Drawing

The drawing illustrates a diagram for fabricating according to the present invention refractive index profile patterns, with the aid of chemical diffusion, in the expanded silylation process.

DETAILED DESCRIPTION

Figure 1:
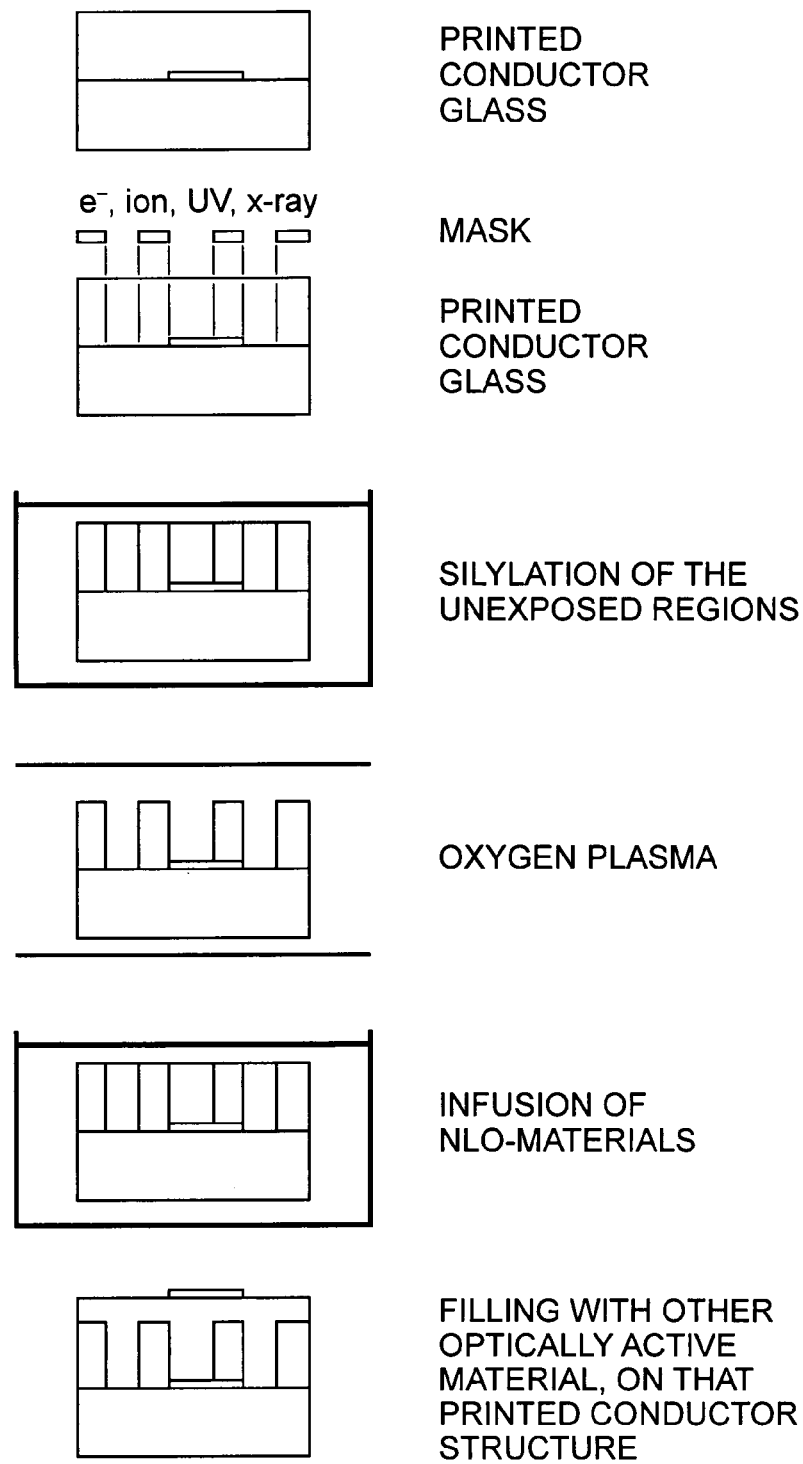

A highly sensitive, patternable polymer layer is deposited on the substrate composed of glass and conductor path. In the exemplary embodiment, Novolak is used. The etching mask is produced by the exposure of defined regions of the polymer resist layer, corresponding to the later component, in conjunction with a process of silylating the unexposed regions. By combining the silylation process used for high-resolution pattern definition with the dry etching of the cross-linked polymers to produce the great height-to-width ratios of the patterns, it is ensured that the non-cross-linked/ unexposed material is available for further chemical diffusion of monomers for the various desired effects. This part of the material is normally removed in the development process when the negative working novolak is exposed. It is retained after dry etching as a result of the silylation. If the silylation process is begun with a short isotropic process attacking the silicon oxide of the silylation mask, the pattern broadens, but the rough edge structure of the silylated region, obtained by the shot noise of the electron exposure in the edge region of the mask, is smoothed.

Thus, in the following anisotropic dry etching process, which employs an etchant that attacks the silicon oxide of the etching mask, it is possible to use directional oxygen ions to achieve smooth side walls of the polymer. This solves the shot-noise edge roughness problem inevitably encountered in corpuscular beam optics. The scattering losses to be expected at the rough surfaces are also minimized.

In the subsequent diffusion process, the polymer then swells on all sides, with the result that the edge region that had been previously lost can be compensated for in a controlled manner by the swollen material, and by the diffusion time and temperature. By diffusing heavy metal oxide-containing, nonlinearly optical compounds or other similar compounds, or molecules contained in "rare earths", into the uncovered deep polymer patterns, nonlinearly optical active materials can also be produced, in addition to passive materials, in selected regions. Thus, diffused refractive index profiles can be produced in regions defined by optical and corpuscular beam lithography. Such diffusion can take place, as in a conventional manner, into unetched polymer layers, resulting in refractive index differences of up to 10%. If diffusion is carried out in polymer layers already patterned using wet chemical development or by dry etching, then refractive index differences of between 1.5 and 3 can be achieved.

Using this process, one can increase the refractive index difference of $10^{-3}$ to $10^{-4}$ to 0.06, in the case of UV-and electron-exposed plexiglass, as the difference in the refractive index between silylated and unsilylated novolak. The refractive index differences attained can be further increased by dissolving resist regions, negatively polymerized by the exposure process, out of the optically active and passive pattern, using high-resolution oxygen dry etching, resulting in refractive index differences with respect to vacuum of $n=1$. In the case of the free-standing, silylated region, the refractive index difference increases to 1.57, while it is 1.63 for the unsilylated material. Consequently, the finished component is made of chemically inert, saturated materials of glass-like composition and good durability. The diffused regions can be cross-linked with long-term stability by UV deep cross-linking, rendering possible a long service life for the components. Electrical and integrated optical components can be easily combined in the layers of the component, because the process involves processes that have been used for a number of years in lithography. Fabrication is accelerated, because the novolak resist systems are characterized by approx. 20 times higher sensitivity in comparison with PMMA (plexiglass). The oxygen etching process additionally tempers the regions diffused with chemicals and, thus, ensures the durability of the components.

The process according to the invention present makes it possible to produce high-quality and highly effective diffractive patterns having few grating planes or lines and, thus, to fabricate integrated optical components, such as couplers, gratings, selectors and reflectors having few grating periods. By employing such high refractive index differences in the optical patterns and gratings, one can achieve the same optical quality using much shorter components, than is possible using polymer-plexiglass techniques. This greatly increases the packing density of the integrated optical elements in miniaturized integrated optics. The following are possibilities for implementing the optical components according to the present invention on a large scale:

1. Using beam-guiding or die-mask-projecting lithography tools featuring variably shaped beams, fast development steps could be carried out in the technology, in short time periods, for small quantities.
2. The optoelectronic components according to the present invention can be preferably mass produced cost-effectively using conventional lithography processes known from optical memory device construction, such as corpuscular-beam and optical-template projection techniques, and optical mask projection techniques, including X-ray lithography processes. The process makes it possible to increase the packing density of future integrated monomode optics and simultaneously produce large quantities in a cost-effective manner.

What is claimed is:

1. A process for fabricating active and passive polymer-based components for use in integrated optics according to a principle based on one of a gas-phase diffusion and a liquid-phase diffusion, comprising the steps of:

depositing onto an optoelectronic component at least one patternable polymer resist layer that is highly sensitive and that effects an intense polymerization when exposed;

producing an etching mask by exposing defined regions of the at least one patternable polymer resist layer corresponding to a later component;

transferring a geometry of the etching mask through a high-grade anisotropic deep etching into unprotected regions of the at least one patternable polymer resist layer located underneath the etching mask, wherein an etching agent is used that avoids attacking a silicon oxide of the etching mask, such that exposed regions of the at least one patternable polymer resist layer are ablated in a vertical direction, and side surfaces of regions protected by the etching mask are uncovered; and filling unexposed regions of the at least one patternable resist layer with organometallic compounds arranged in a monomer form, the organometallic compounds being suitable for filling an already existing pattern of the at least one patternable polymer resist layer and for breaking up and repatterning the already existing pattern, wherein an optical property of the optoelectronic component is selectively changeable as a function of a type of the monomeric organometallic compounds and as a function of a temperature and an application time, the filling of the unexposed regions of the at least one patternable resist layer occurring, through one of the gas-phase diffusion and the liquid-phase diffusion and with an application of heat, from a surface of the unexposed regions through the etching mask, and occurring from the side surfaces uncovered by the deep etching, so that at least one of the active and the passive polymer-based components for use in integrated optics is fabricated.

2. The process according to claim 1, wherein the at least one patternable polymer resist layer includes novolak.

3. The process according to claim 1, wherein the organometallic compounds include heavy metal-containing compounds.

4. The process according to claim 1, further comprising the step of:
selectively controlling a swelling occurring during the one of the gas-phase diffusion and the liquid-phase diffusion in the at least one patternable polymer resist layer by varying a time for the one of the gas-phase diffusion and the liquid-phase diffusion and varying the temperature until a compensation for pattern inaccuracies occurs.

5. The process according to claim 1, further comprising the step of:
using one a vacuum and air at a standard pressure in interstices of the at least one patterned polymer resist layer in order to adjust a difference in refractive indices of >1.5 with respect to patterns in the filled at least one patternable polymer resist layer.

6. The process according to claim 1, wherein:
the at least one patternable polymer resist layer includes a polymer pattern filled with the monomeric organometallic compounds,
the polymer pattern filled with the monomeric organometallic compounds is surrounded by electrical electrodes, and
optical properties of the polymer pattern filled with the monomeric organometallic compounds are influenced by controlling an electrical field applied between the electrical electrodes.

7. The process according to claim 1, wherein:
the at least one patternable polymer resist layer includes a polymer pattern filled with the monomeric organometallic compounds,
the polymer pattern filled with the monomeric organometallic compounds is connected to waveguides,
light is injected through the waveguides and into the polymer pattern filled with the monomeric organometallic compounds, and
optical properties of the polymer pattern filled with the monomeric organometallic compounds are influenced by varying the injected light.

8. The process according to claim 1, wherein:
the etching mask is produced by performing the steps of:
exposing defined regions of the at least one patternable polymer resist layer corresponding to the later component,
performing a silylation of the unexposed regions of the at least one patternable polymer resist layer, and
after performing the silylation, smoothing edged of the etching mask by an isotropic etching attack using an agent which attacks the silicon oxide of the etching mask.

* * * * *